(12) United States Patent
Mo et al.

(10) Patent No.: US 7,656,089 B2
(45) Date of Patent: Feb. 2, 2010

(54) TAPE CARRIER PACKAGE ON REEL AND PLASMA DISPLAY DEVICE USING THE SAME

(75) Inventors: Bu-Kyeong Mo, Suwon-si (KR); Jong-Bong Ha, Suwon-si (KR); Seung-Hak Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 495 days.

(21) Appl. No.: 11/294,360

(22) Filed: Dec. 6, 2005

(65) Prior Publication Data

US 2006/0132692 A1    Jun. 22, 2006

(30) Foreign Application Priority Data

Dec. 7, 2004    (KR) ............... 10-2004-0102274

(51) Int. Cl.
*H01J 17/49* (2006.01)
*H05K 1/00* (2006.01)

(52) U.S. Cl. ..................... 313/582; 361/748

(58) Field of Classification Search ......... 313/582–587; 361/681, 748–749
See application file for complete search history.

(56) References Cited

U.S. PATENT DOCUMENTS

| | | | |
|---|---|---|---|
| 5,177,596 A | 1/1993 | Muramatsu et al. | |
| 6,333,467 B1 | 12/2001 | Matsuo | |
| 6,559,522 B1* | 5/2003 | Kang | 257/668 |
| 6,703,702 B2 | 3/2004 | Inoue et al. | |
| 6,744,638 B2 | 6/2004 | Terasaka | |
| 7,061,177 B2 | 6/2006 | Kang et al. | |
| 2003/0214053 A1* | 11/2003 | Cho | 257/797 |

FOREIGN PATENT DOCUMENTS

| | | |
|---|---|---|
| CN | 1 459 768 | 12/2003 |
| CN | 1 474 479 | 2/2004 |
| JP | 58-034952 | 3/1983 |
| JP | 63-172169 U | 11/1988 |
| JP | 03-084955 | 4/1991 |
| JP | 11-317428 | 11/1999 |
| JP | 2000-252598 | 9/2000 |
| JP | 2002-314212 | 10/2002 |
| JP | 2003-115568 | 4/2003 |
| KR | 1994-0018955 A | 8/1994 |
| WO | WO 00/48243 | 8/2000 |

* cited by examiner

*Primary Examiner*—Karabi Guharay
(74) *Attorney, Agent, or Firm*—Lee & Morse, P.C.

(57) ABSTRACT

A Tape Carrier Package (TCP) that is attachable to and detachable from a connector of a Printed circuit Board Assembly (PBA) of a plasma display apparatus that includes a plurality of electrodes, and a plasma display device including the same. The TCP includes an input portion that is attachable to and detachable from the PBA, an output portion that is attachable to and detachable from one of the plurality of electrodes of the plasma display apparatus, and at least one alignment mark, at least a portion of the alignment mark corresponding to or abutting an edge of the input portion.

10 Claims, 5 Drawing Sheets

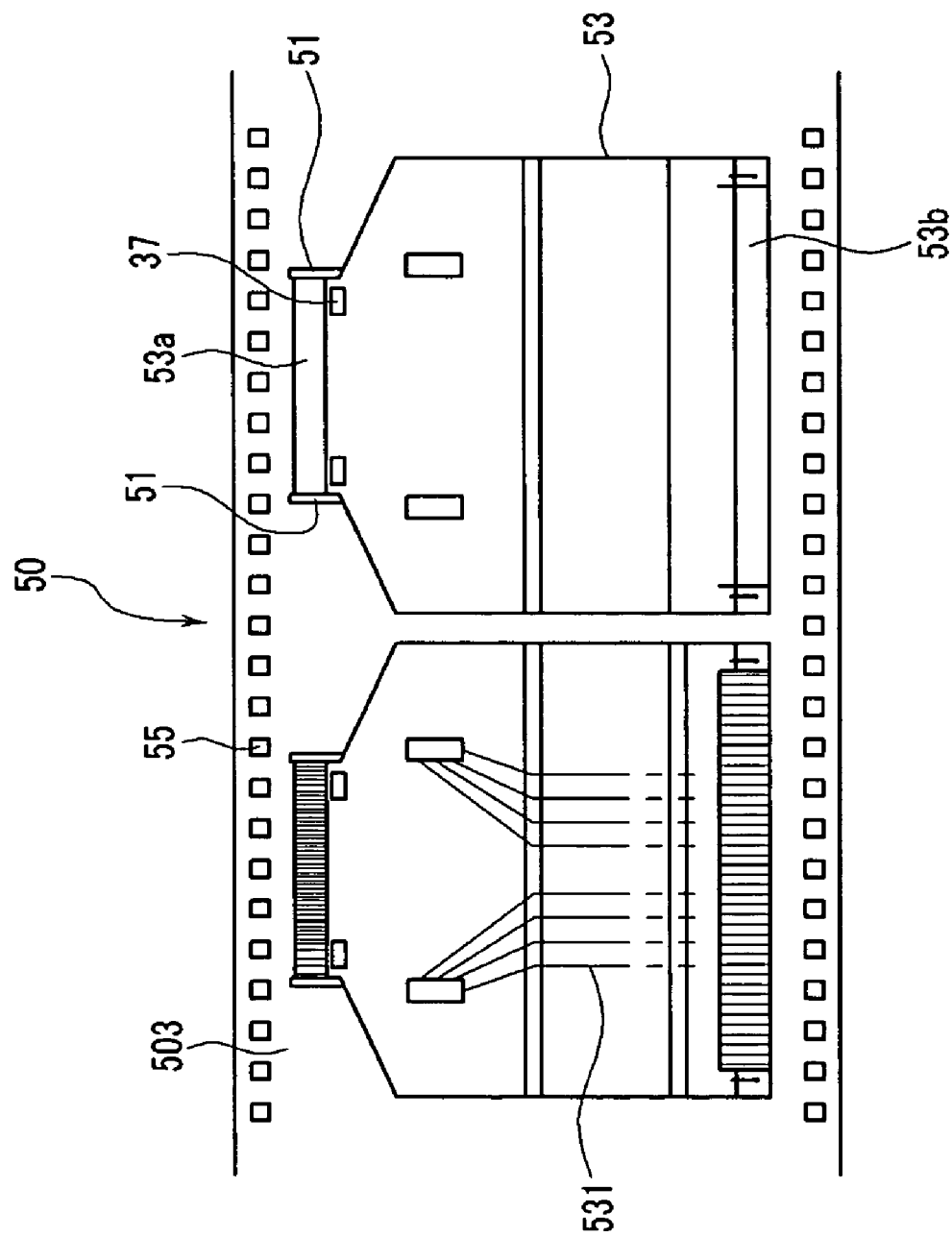

TAPE CARRIER PACKAGE ON REEL AND PLASMA DISPLAY DEVICE USING THE SAME

BACKGROUND OF THE INVENTION

1. Field of the Invention

The present invention relates to a Tape Carrier Package (hereinafter referred to as a "TCP") on a reel, and a plasma display device using the same. More particularly, the present invention relates to a TCP reel, and a plasma display device using the same in which at least one punch inducing portion is formed on the TCP to enable accurate punching of the TCP; a TCP on a reel that may reduce or prevent, misalignment of a connector and the TCP when employing the TCP; and a TCP including a positioning section that enables confirmation of proper coupling of the TCP with a connector.

2. Description of the Related Art

Plasma display devices are devices that display images through a Plasma Display Panel (PDP) (hereinafter referred to as a "panel") using plasma generated by gas discharge.

Typically, a plurality of discharge cells are defined within the panel by barrier ribs. Electrodes that correspond to the discharge cells and generate gas discharge are provided within the panel. The electrodes extend beyond the panel as electrode terminals. The electrode terminals are connected to terminals of a Flexible Printed Circuit (hereinafter referred to as "FPC") that is connected to a Printed circuit Board Assembly (PBA).

Therefore, the electrodes are electrically connected to the PBA via the electrode terminals and the FPC.

The FPC may have one terminal connected to the PBA by a connector and the other terminal connected to the respective electrode terminal of the panel by, for example, thermal compression.

Driver integrated circuits (driver ICs) are generally placed between driving elements mounted in the PBA and the electrodes of the panel. The driver ICs transfer a driving voltage, a video signal, and the like, which are received from the driving elements, to the electrodes of the panel. The driver ICs are applied to a plasma display device in package form and can be classified into COF (Chip On Film), COB (Chip On Board), and TCP (Tape Carrier Package) depending on a packaging method.

TCPs may be used to package semiconductor integrated circuits (ICs) such as driver ICs by utilizing a tape carrier on a reel that packages semiconductor devices. The tape carrier generally has a three-layered structure in which a copper foil is adhered to a polyimide film by an adhesive.

A circuit is formed in the copper foil through several steps of tape manufacturing processes.

The TCPs are generally consecutively connected on a reel. TCP manufacturers supply such reels to plasma display module manufacturers.

The module manufacturer slices the TCPs into pieces by punching out individual units using a TCP puncher.

In a plasma display device, a TCP generally has an input terminal connected to the PBA by a connector and an output terminal connected to the electrode terminal of the panel through thermal compression.

Through the above construction, the TCP electrically connects the PBA and the electrodes of the panel, and transfers a driving voltage and a video signal of the PBA to the panel.

In the case of a TCP supplied in reel form as described above, the TCP input terminal may become irregular or defective if, for example, there is gap between a TCP puncher and a respective unit. When punching is carried out in such conditions, the TCP may not properly align with a connector of a PBA and a short circuit or open circuit may result.

In known devices, it may be difficult to confirm whether the input terminal is properly connected to the respective connector. In particular, it may be difficult for the naked eye to confirm whether the input terminal has been accurately inserted into the connector when the TCP input terminal is inserted into the connector.

The information disclosed above in this Background section is only provided to aid in understanding of one or more aspects of the present invention described in detail below.

SUMMARY OF THE INVENTION

The present invention is therefore directed to a TCP on a reel and a plasma display apparatus employing such a TCP, which substantially overcomes one or more of the problems due to the limitations and disadvantages of the related art.

It is therefore a feature of embodiments of the present invention to provide a TCP on a reel and a plasma display device using the same having advantages in which accurate punching of the TCP is induced in a reel state.

It is therefore another feature of embodiments of the present invention to provide a TCP on a reel and a plasma display device using the same that helps prevent misalignment of a connector and the TCP.

It is yet another feature of embodiments of the present invention to provide a TCP that enables an accurate assembly of the connector and the TCP to be confirmed.

At least one of the above and other features and advantages of the present invention may be realized by providing a plasma display device including a plasma display panel, a frame that supports the plasma display panel, a Printed Circuit board Assembly (PBA) including driving circuit elements for driving the plasma display panel, and a Tape Carrier Package (TCP) including an input portion connected to the PBA, an output portion connected to a driving electrode of the plasma display panel, and at least one alignment mark formed on the TCP, the alignment mark being formed adjacent to the input portion.

A connector to which the input portion of the TCP may be coupled may be provided on the PBA. At least one alignment mark may be formed at a location corresponding to an edge of the connector.

At least one pair of the alignment marks may be formed. At least a portion of each alignment mark of the pair may abut or overlap one of the edges the connector when the input portion is detachably attached to the connector. At least one alignment mark may have a rectangular shape and one side of the alignment mark may be parallel to the edge of the connector.

The TCP may include a film layer, and copper foils attached to the film layer to form a circuit wire, and the at least one alignment mark may be provided by forming a hole in the film layer. The hole formed in the film layer of the TCP may be filled with resin covering the copper foils. The resin may have a color different from that of a color of the film layer.

At least one of the above and other features and advantages of the present invention may also be realized by providing a Tape Carrier Package (TCP) reel in which Integrated Circuits (ICs) are packaged into a tape carrier including copper foils that form a circuit wire having an input portion and an output portion, the copper foils being joined with the ICs to form a plurality of unit patterns, and a film layer being attached to the copper foils, wherein at least one slit that penetrates the film layer is formed outside a first edge of the input portion of each of the unit patterns.

The slit may be formed adjacent to the first edge of the input portion and another slit may be formed adjacent to a second edge of input portion, the first edge being substantially opposite to the second edge on the respective unit pattern. At least one alignment mark may be formed on each of the unit patterns, at least a portion of the alignment mark may correspond to or be adjacent to a third edge of the input portion, where the third edge of the input portion is different from the first edge of the input portion. At least a pair of the alignment marks may be formed, at least a portion of each alignment mark of the pair may correspond to or be adjacent to a third edge of the input portion, the third edge of the input portion being different from the first edge of the input portion. The alignment mark may be formed to have a rectangular shape and one side parallel to the third edge of the input portion of the respective pattern. The alignment mark may be provided by forming a hole in the film layer. The hole may be filled with a resin covering the copper foils. The resin may have a color that is different from a color of the film layer.

At least one of the above and other features and advantages of the present invention may further be realized by providing a Tape Carrier Package (TCP) that is attachable to and detachable from a connector of a Printed circuit Board Assembly (PBA) of a plasma display apparatus that includes a plurality of electrodes, the TCP including an input portion that is attachable to and detachable from the PBA, an output portion that is attachable to and detachable from one of the plurality of electrodes of the plasma display apparatus, and at least one alignment mark, at least a portion of the alignment mark corresponding to or abutting an edge of the input portion.

The TCP may be a punched-out unit pattern from a plurality of unit patterns on a tape carrier that includes copper foils, a film layer overlapping the copper foils, and at least one slit in the film layer adjacent to an edge of the input portion.

The TCP may include a film layer and copper foils attached to the film layer to form a circuit wire. At least one alignment mark may be provided by forming a hole in the film layer. The hole formed in the film layer may be filled with a resin. The resin may have a color that is different from a color of the film layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 5 illustrates a partial top plan view of a TCP on a reel according to an exemplary embodiment of the present invention.

DETAILED DESCRIPTION OF THE OF THE INVENTION

Figure 1:
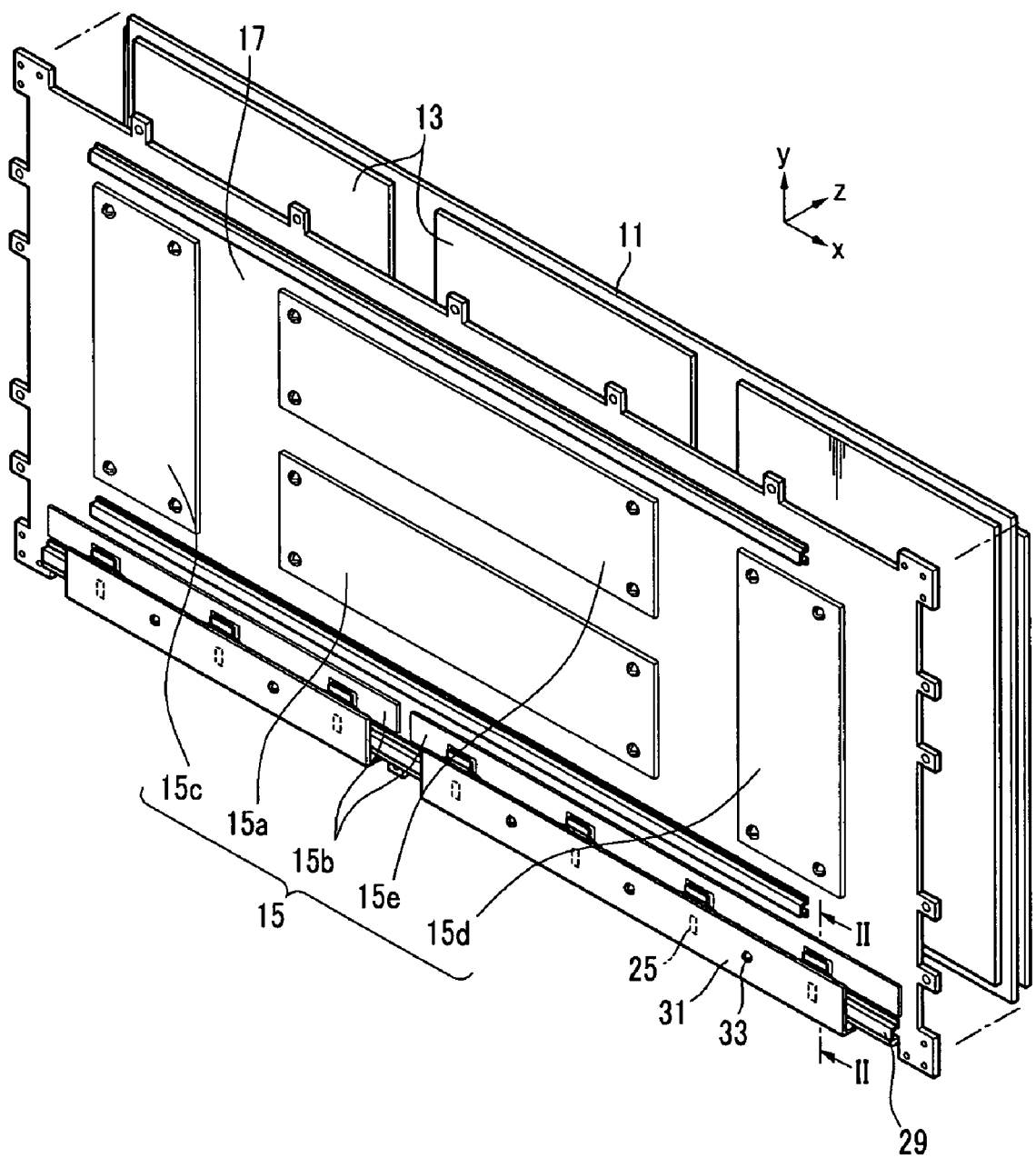
FIG. 1 illustrates a perspective view of a plasma display device according to an exemplary embodiment of the present invention.

Korean Patent Application No. 10-2004-0102274, filed on Dec. 7, 2004, in the Korean Intellectual Property Office, and entitled, "Tape Carrier Package on Reel and Plasma Display Device Using the Same," is incorporated by reference herein in its entirety.

The present invention will now be described more fully hereinafter with reference to the accompanying drawings, in which exemplary embodiments of the present invention are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
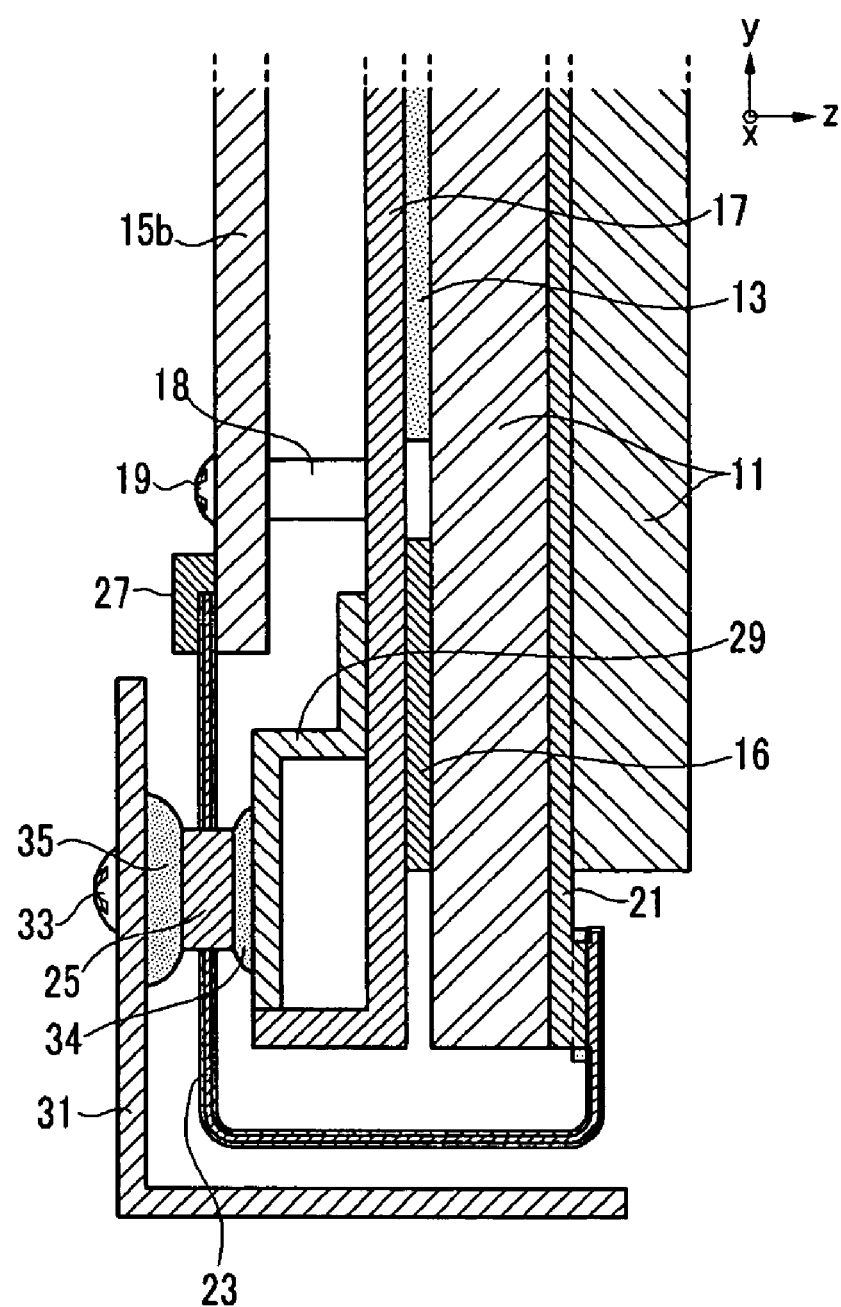
FIG. 2 illustrates a cross-sectional view taken along line II-II of FIG. 1.

FIG. 1 illustrates a perspective view of a plasma display device according to an exemplary embodiment of the present invention. FIG. 2 illustrates a cross-sectional view along line II-II of the plasma display device shown in FIG. 1.

Referring to FIGS. 1 and 2, the plasma display device may include a plasma display panel PDP 11 (hereinafter referred to as a "panel") that displays images using gas discharge phenomena, a heat dissipation sheet 13, a Printed circuit Board Assembly (PBA) 15 electrically connected to the panel 11 in order to drive the panel 11, and a frame base 17 supporting the panel 11 on a rear surface of the panel 11. The heat dissipation sheet 13 may function to conduct and diffuse heat generated by the panel 11. The panel 11 may be adhered to a front surface of the frame base 17 by a double-sided adhesive member 16, e.g., double-sided adhesive tape. The PBA 15 may be mounted on a rear surface of the frame base 17.

Aspects of the present invention may improve a coupling relationship between the panel 11 and other constituent elements. One or more aspects of the present invention may be applied and used in conjunction with various other types of display apparatuses. Accordingly, description of the panel 11 itself will be limited to those aspects that are necessary to understand the present invention.

The PBA 15 may be mounted on a boss 18 of the frame base 17 by a fixing member such as a screw 19. The PBA 15 may be provided with various circuit elements for driving the panel 11. The PBAs may include an image processing/control board 15a that receives an external video signal, and generates a control signal necessary to drive an address electrode 21 and control signals necessary to drive a sustain electrode and a scan electrode (not shown). The image processing/control board 15a may apply the generated signals to an address buffer board 15b, a scan driving board 15c, and a sustain driving board 15d, respectively. A power supply board 15e may supply power necessary to drive the plasma display device.

To drive the panel 11 constructed as described above, the address buffer board 15b of the PBA 15 may be electrically connected to the address electrode 21 of the panel 11 through a TCP 23. The scan driving board 15c may be electrically connected to the scan electrode (not shown) of the panel 11 through the TCP 23.

Driver ICs 25 may be packaged in the TCP 23 utilizing a tape carrier on a reel. The TCP 23 may have one side connected to the address electrode 21 and another side connected to the address buffer board 15b.

The driver ICs 25 may be disposed between a frame bed 29 and a compression plate 31. Thermal transfer members 34 and 35 may be disposed on sides of the driver ICs 25 that are sandwiched between the frame bed 29 and the compression plate 31. The compression plate 31 may be mounted in the frame bed 29 with a fixing member such as a screw 33.

The driver ICs 25 may selectively apply an address pulse to the address electrode 21 of the panel 11 according to a control signal of the address buffer board 15b. A discharge cell of the panel 11 that is to be turned on during a next sustain period may be selected according to the address pulse applied to the address electrode 21 and a scan pulse applied to the corresponding scan electrode.

Figure 3:
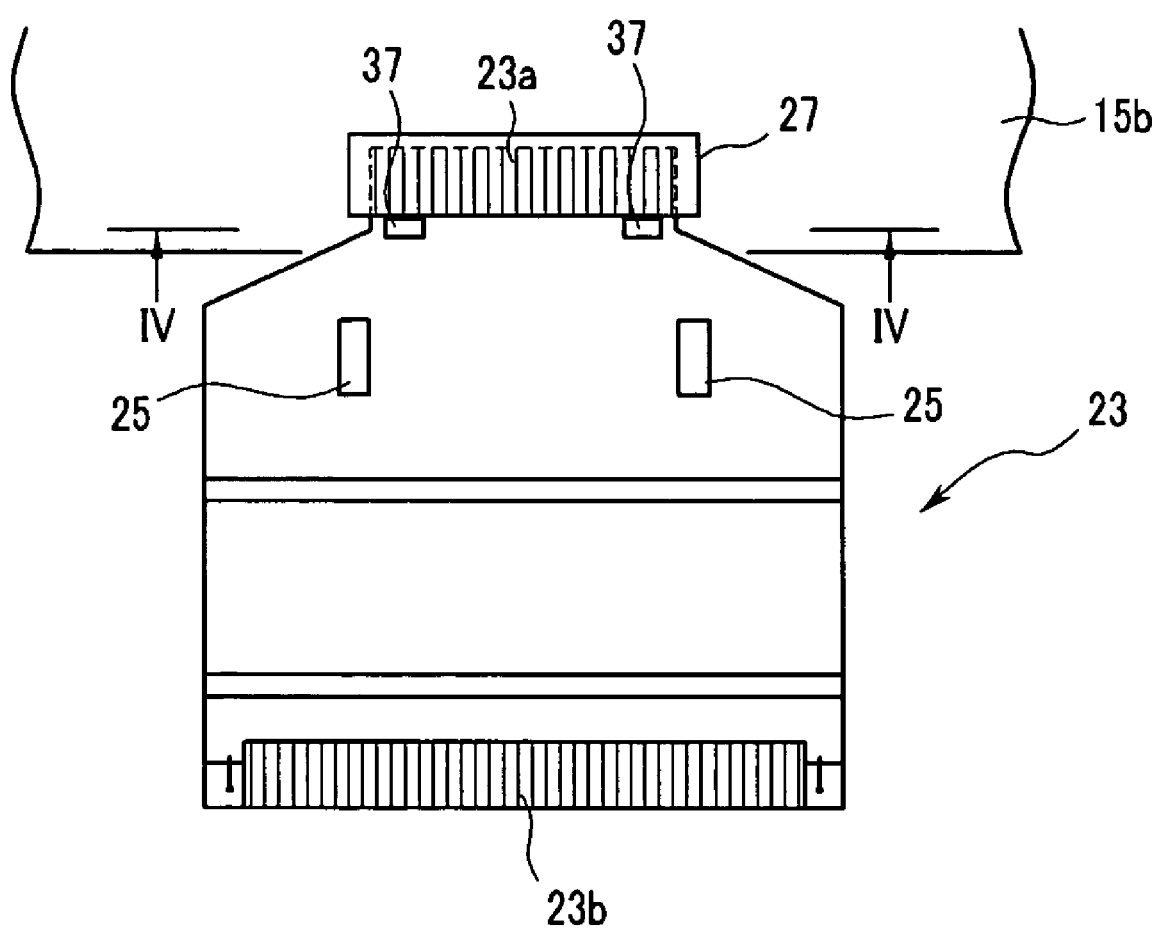
FIG. 3 illustrates a plan view showing an exemplary embodiment of a TCP coupled to a portion of the plasma display device shown in FIG. 1.
Figure 4:
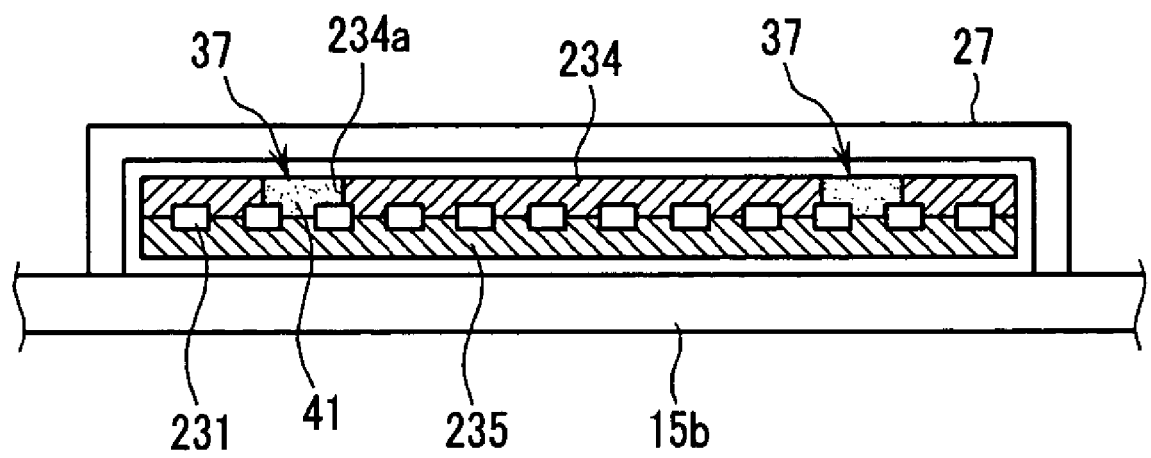
FIG. 4 illustrates a cross-sectional view taken along line IV-IV of FIG. 3.

FIG. 3 illustrates a plan view of a TCP coupled to a portion of the plasma display device according to an exemplary embodiment of the present invention. FIG. 4 illustrates a cross-sectional view taken along line IV-IV of FIG. 3.

The TCP 23 on which the driver ICs 25 are packaged may include an input portion 23a and an output portion 23b. One lateral end of the TCP 23 that corresponds to the input portion 23a may be coupled to the address buffer board 15b. Another lateral end of the TCP 23 that corresponds to the output portion 23b may be connected to the address electrode 21 of the panel 11. A connector 27 may be provided on the address buffer board 15b. As shown in FIG. 3, the input portion 23a of the TCP 23 may be coupled to the connector 27 by being inserted into the connector 27.

Alignment marks 37 may be formed on the TCP 23. The alignment marks 37 may be formed on the TCP 23 at a portion of the TCP that is adjacent to the input portion 23a. The alignment marks 37 may be formed at locations corresponding to corners of the connector 27. In embodiments of the present invention, such as the exemplary embodiment shown in FIG. 3, a pair of the alignment marks 37 may be formed corresponding to side edges of the connector 27.

The alignment marks 37 may have a rectangular shape. One side of the rectangular shape may be formed parallel to at least the edge of the connector 27. When the input portion 23a of the TCP 23 is inserted into the connector 27, it can be easily determined whether the input portion 23a of the TCP 23 has been accurately coupled to the connector 27 by confirming that the edge of the connector 27 and the respective side of the alignment marks 37 are disposed parallel to each other.

When the input portion 23a of the TCP 23 is coupled to the connector 27 by inserting the input portion 23a into the connector 27, it may easily be determined whether the input portion 23a of the TCP 23 has been inserted to a proper depth into the connector 27 when, for example, the edge of the connector 27 and one side of the alignment marks 37 overlap each other or are very close to each other.

The TCP 23 may include copper foils 231 and film layers 234 and 235, as shown in FIG. 4. The copper foils 231 may form a circuit wire and may be joined with the driver ICs 25. In embodiments of the present invention, the copper foils 231 may be adhered to the film layers 234 and 235 by an adhesive. The film layers 234 and 235 may be formed of a polyimide film.

The film layers 234 and 235 may be adhered on front and rear surfaces of the copper foils 231. When the film layers 234 and 235 are adhered on front and rear surfaces of the copper foils 231 as described above, the TCP 23 may have a three-layered structure.

Alignment marks 37 may be provided by forming a hole 234a in the film layer 234. Before the film layer 234 is attached to the copper foils 231, the hole(s) 234a may be formed at location(s) of the film layer 234 where the alignment marks 37 are to be formed. After the copper foils 231 are attached to the film layer 234, the penetration hole(s) 234a may filled with resin 41. The resin 41 may function to help prevent the circuit wire of the copper foils 231 from being exposed through the penetration hole(s) 234a.

The resin 41 may include a transparent resin. However, the present invention is not limited to a transparent resin. A color of the resin 41 can be different from a color of the film layer 234. The alignment marks 37 may have a color that allows the alignment marks 37 to be distinguished from the film layer 234.

FIG. 5 illustrates a partial top plan view of a TCP on a reel according to an exemplary embodiment of the present invention. A TCP packages integrated circuits (ICs) in a tape carrier. A tape carrier on a reel may be used. Referring to FIG. 5, a TCP 50 on a reel may include copper foils 531, and a film layer 503 attached to the copper foils 531. The copper foils 531 may form a plurality of unit patterns 53 that may be connected to the ICs 25.

The unit patterns 53 may include an input portion 53a and an output portion 53b.

One or more slits 51 that penetrate the film layer 503 may be formed in the TCP 50 on the reel. The slit 51 may be formed on one or more sides of the input portion 53a of each unit pattern 53. In embodiments of the present invention, one slit 51 may be formed along opposing edges of the input portion 53a of each of the unit patterns 53 in a width direction, as shown in FIG. 5. The copper foil 531 should not be formed in a portion of the unit pattern 53 corresponding to the slit 51. The slits(s) 51 may be maintained even after the copper foil 531 and the film layer 503 are attached to each other The TCPs 50 on the reel may be punched using a compression apparatus such that every unit pattern 53 is sliced into an individual unit using a die. The output portion 53b of the TCPs sliced as described above may be patterned to match the address electrodes 21 of the panel 11 one to one. The output portion 53b of the TCP 50 may be attached to the address electrode 21 through a thermal compression process.

The TCP 50 on the reel may include transfer holes 55, as shown in FIG. 5. The transfer holes 55 may be coupled to the compression apparatus and may help transfer the reel relative to the compression apparatus in order to punch out the unit patterns 53.

When the slit(s) 51 are formed as described above, the unit patterns 53 of the TCP 50 can be punched out more accurately regardless of a gap between the die and the unit pattern 53. More particularly, the slit(s) 51 that is already punched or open helps the unit pattern 53 to be more easily punched out. For example, in the exemplary embodiment illustrated in FIG. 5, the sides of the input portion 53a with the slit 51 do not experience the same punching force of the die that the sides of the output portion 53b experience upon punching. The punching stress that is concentrated on both sides of the input portion 53a can be reduced or eliminated. By employing one or more aspects of the present invention, problems related to punching error can be reduced or prevented. By employing one or more aspects of the present invention, problems related to gaps or misalignment of a puncher can be reduced or prevented. By employing one or more aspects of the present invention, burrs or ridges that may be generated in the film layer 503 upon punching may be reduced or prevented. For example, in the exemplary embodiment illustrated in FIG. 5, the slits 51 may help reduce or prevent burrs that may be generated at both sides of the input portion 53a.

Embodiments of the present invention provide a more accurately formed input portion of a TCP that can help reduce or prevent, alignment errors that may occur when, for example, the input portion is inserted into a connector. Embodiments of the present invention provide a more accurately formed TCP that may help reduce or prevent, wire failures such as a disconnected wire or shorted wires.

In the TCP 50 on the reel, the alignment marks 37 may be formed adjacent to the input portion 53a of each of the unit patterns 53. In embodiments of the present invention, one or more alignment marks 37 may be formed in a width direction along one or more side edges of the input portion 53a of each of the unit patterns 53.

The alignment marks 37 may have a rectangular shape. One side of the rectangular shaped alignment marks 37 may be formed parallel to at least an edge of the input portion of the unit pattern 53. In embodiments of the present invention, it can be easily determined whether the TCP has been accurately coupled to a connector by confirming that an edge of the connector and one side of the alignment marks are disposed in parallel.

Embodiments of the present invention make it possible to determine whether an input portion of a TCP has been inserted into a connector to a proper depth when an edge of the connector and one side of one or more alignment marks overlap each other or are very close to each other.

In embodiments of the present invention, one or more alignment marks may be provided at locations corresponding to edges of a connector on an input portion side of a TCP. In such embodiments of the present invention, when the TCP is connected to a connector of a PBA, it may be possible to easily determine whether the connector and the TCP are accurately assembled.

One or more aspects of the present invention may provide a TCP reel that includes one or more slits on a side of an input portion of each unit pattern provided in a film layer. Accurate punching of TCPs that are supplied in a reel state may be achieved even when there is a gap between a TCP puncher and the unit pattern. In such embodiments of the present invention, misalignment of a connector and a TCP may be reduced, or prevented, when the punched TCP is assembled into the connector.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device, comprising:
   a plasma display panel;
   a frame that supports the plasma display panel;
   a Printed Circuit board Assembly (PBA) including driving circuit elements for driving the plasma display panel; and
   a Tape Carrier Package (TCP) including:
      an input portion connected to the PBA;
      an output portion connected to a driving electrode of the plasma display panel;
      a film layer,
      conductive patterns attached to the film layer to form a circuit wire, and
      at least one alignment mark formed on the TCP, the alignment mark being formed adjacent to the input portion, the at least one alignment mark being an opening in the film layer, wherein the conductive patterns include copper foils and the opening formed in the film layer of the TCP is filled with resin covering the copper foils.

2. The plasma display device as claimed in claim 1, wherein a connector to which the input portion of the TCP is coupled is provided on the PBA, and the at least one alignment mark is formed at a location corresponding to an edge of the connector.

3. The plasma display device as claimed in claim 2, wherein at least one pair of the alignment marks is formed and at least a portion of each alignment mark of the pair abuts or overlaps one of the edges of the connector when the input portion is detachably attached to the connector.

4. The plasma display device as claimed in claim 2, wherein the at least one alignment mark has a rectangular shape and one side of the alignment mark is parallel to the edge of the connector.

5. The plasma display device as claimed in claim 1, wherein:
   the conductive patterns are copper foils.

6. The plasma display device as claimed in claim 1, wherein the resin has a color different from a color of the film layer.

7. A Tape Carrier Package (TCP) that is attachable to and detachable from a connector of a Printed circuit Board Assembly (PBA) of a plasma display apparatus that includes a plurality of electrodes, the TCP including:
   an input portion that is attachable to and detachable from the PBA;
   an output portion that is attachable to and detachable from one of the plurality of electrodes of the plasma display apparatus; and
   at least one alignment mark, at least a portion of the alignment mark corresponding to or abutting an edge of the input portion, the at least one alignment mark extending substantially parallel to the edge of the input portion; and
   a film layer including copper foils attached thereto, wherein the at least one alignment mark is provided by forming a hole in the film layer to form a circuit wire, and the hole in the film layer is filled with resin covering the copper foils.

8. The TCP as claimed in claim 7, wherein the TCP is a punched-out unit pattern from a plurality of unit patterns on a tape carrier that includes copper foils, a film layer overlapping the copper foils, and at least one slit in the film layer adjacent to an edge of the input portion.

9. A Tape Carrier Package (TCP) that is attachable to and detachable from a connector of a Printed circuit Board Assembly (PBA) of a plasma display apparatus that includes a plurality of electrodes, the TCP including:
   an input portion that is attachable to and detachable from the PBA;
   an output portion that is attachable to and detachable from one of the plurality of electrodes of the plasma display apparatus;
   a film layer; and
   at least one alignment mark, at least a portion of the alignment mark corresponding to or abutting an edge of the input portion, the at least one alignment mark corresponding to a hole in the film layer, wherein the hole formed in the film layer is filled with a resin.

10. The TCP as claimed in claim 9, wherein the resin has a color different from a color of the film layer.

* * * * *